United States Patent
Lee

(10) Patent No.: US 12,394,672 B2
(45) Date of Patent: Aug. 19, 2025

(54) METHOD FOR EVALUATING OF DEFECT AREA OF WAFER

(71) Applicant: SK SILTRON CO., LTD., Gyeongsangbuk-do (KR)

(72) Inventor: Kyu Hyung Lee, Gyeongsangbuk-do (KR)

(73) Assignee: SK SILTRON CO., LTD., Gumi-si (KR)

(*) Notice: Subject to any disclaimer, the term of this patent is extended or adjusted under 35 U.S.C. 154(b) by 698 days.

(21) Appl. No.: 17/712,484

(22) Filed: Apr. 4, 2022

(65) Prior Publication Data

US 2023/0118491 A1  Apr. 20, 2023

(30) Foreign Application Priority Data

Oct. 14, 2021  (KR) .................. 10-2021-0136487

(51) Int. Cl.
*H01L 21/66* (2006.01)
*G01N 21/95* (2006.01)

(52) U.S. Cl.
CPC ......... *H01L 22/12* (2013.01); *G01N 21/9501* (2013.01)

(58) Field of Classification Search
CPC ...................................................... H01L 22/12
See application file for complete search history.

(56) References Cited

U.S. PATENT DOCUMENTS

| | | | | | |
|---|---|---|---|---|---|
| 4,547,073 | A | * | 10/1985 | Kugimiya | G01N 21/9501 356/613 |
| 5,674,756 | A | * | 10/1997 | Satoh | H01L 21/3225 257/E21.321 |
| 6,066,571 | A | * | 5/2000 | Usuda | H01L 21/02052 257/E21.228 |
| 6,140,210 | A | * | 10/2000 | Aga | H01L 21/76254 438/455 |
| 6,544,656 | B1 | * | 4/2003 | Abe | C30B 15/00 257/E21.321 |
| 6,726,319 | B1 | * | 4/2004 | Yanase | G01N 21/9501 250/559.27 |
| 2002/0155630 | A1 | * | 10/2002 | Iwabuchi | G01N 21/9501 257/E21.53 |
| 2002/0174828 | A1 | * | 11/2002 | Vasat | H01L 21/02049 117/90 |

(Continued)

FOREIGN PATENT DOCUMENTS

| | | |
|---|---|---|
| JP | 3451955 | 9/2003 |
| JP | 2017-220587 | 12/2017 |

(Continued)

OTHER PUBLICATIONS

Korean Notice of Allowance dated Apr. 5, 2024 issued in Application No. 10-2021-0136487.

(Continued)

*Primary Examiner* — William A Harriston
(74) *Attorney, Agent, or Firm* — KED & ASSOCIATES, LLP

(57) ABSTRACT

A method of evaluating a defect area on a wafer, the method including preparing a mirror-polished wafer, heat-treating the wafer, cleaning the wafer to remove an oxide film (Continued)

formed during the heat-treating, polishing the wafer, and evaluating a defect on a surface of the wafer, is disclosed.

17 Claims, 7 Drawing Sheets

(56) References Cited

U.S. PATENT DOCUMENTS

| | | | | |
|---|---|---|---|---|
| 2006/0280222 A1* | 12/2006 | Nikawa | ............... | G01K 11/12 374/5 |
| 2007/0044709 A1* | 3/2007 | Itou | ............... | H01L 22/12 257/E21.293 |
| 2008/0153186 A1* | 6/2008 | Saito | ............... | H01L 22/24 257/E21.53 |
| 2010/0111802 A1* | 5/2010 | Umeno | ............... | C30B 15/00 423/325 |
| 2010/0290971 A1* | 11/2010 | Itou | ............... | H01L 21/3225 117/2 |
| 2011/0001219 A1* | 1/2011 | Ebara | ............... | C30B 15/00 257/617 |
| 2012/0293793 A1* | 11/2012 | Uchino | ............... | G01N 21/6456 356/237.2 |
| 2013/0192303 A1* | 8/2013 | Ryu | ............... | G01N 21/9505 65/31 |
| 2014/0125374 A1* | 5/2014 | Ham | ............... | H01L 22/12 324/762.05 |
| 2016/0322233 A1* | 11/2016 | Nakayama | ............... | H01L 21/3225 |
| 2018/0190547 A1* | 7/2018 | Lee | ............... | H01L 22/20 |
| 2023/0118491 A1* | 4/2023 | Lee | ............... | H01L 22/24 438/14 |

FOREIGN PATENT DOCUMENTS

| | | |
|---|---|---|
| KR | 10-0763834 | 10/2007 |
| KR | 10-2014-0046420 | 4/2014 |
| KR | 10-2037748 | 11/2019 |
| KR | 10-2060085 | 12/2019 |
| KR | 10-2020-0094976 | 8/2020 |

OTHER PUBLICATIONS

Korean Office Action dated May 31, 2023 issued in Application No. 10-2021-0136487.

* cited by examiner

METHOD FOR EVALUATING OF DEFECT AREA OF WAFER

CROSS-REFERENCE TO RELATED PATENT APPLICATIONS

This application claims the benefit of Korean Patent Application No. 10-2021-0136487, filed on Oct. 14, 2021, which is hereby incorporated by reference as if fully set forth herein.

BACKGROUND OF THE INVENTION

Field of the Invention

The present invention relate to a method of evaluating a defect area on a wafer, and more particularly to a method of defining a reactive ion etching (RIE) defect area through heat treatment and surface polishing.

Discussion of the Related Art

A silicon wafer used as a material for producing electronic components such as semiconductors or solar cells is manufactured by a series of processes after growing a single crystal silicon ingot using the Czochralski (CZ) method or the like. Then, a semiconductor is manufactured by a process such as implanting predetermined ions into a wafer and forming a circuit pattern.

A silicon wafer is the most basic material for a semiconductor device, and an impurity or a defect has a fatal impact on the manufacturing process of a semiconductor or on a finished semiconductor product. In a silicon wafer, due to a pulling speed V of an ingot and an axial temperature gradient G in a grown ingot at a melt interface, nature and concentration of a point defect change.

As V/G increases, the concentration of vacancies increases, and as V/G decreases, the concentration of vacancies decreases and the concentration of interstitial silicon increases. Then, during cooling of a grown single crystal silicon ingot, reaction between the point defects or reaction between the point defect and the silicon (Si) occurs, thereby generating a crystal defect depending on the type of the point defect (vacancy or interstitial silicon) and the concentration of the point defect.

Since a crystal originated particle (COP) or a large dislocation pit (LDP), which is a typical crystal defect, has a fatal effect on semiconductor manufacturing yield, it is necessary to manufacture a defect-free (crystal defect free) silicon wafer without COP or LDP.

In particular, as semiconductor design rules become finer, a micro-defect that did not previously affect a semiconductor device, now affects a semiconductor device, and therefore, there is a need to control smaller crystal defects.

Point defect behavior of a single crystal silicon ingot is determined by V/G value. As the V/G value increases, a void defect (COP) is generated, and as the V/G value decreases, LDP is generated, and between a section where the V/G value is high and a section where the V/G value is low, there exists an O-band area (an area where a defect in a form of oxygen precipitate is generated and an oxidation induced stacking fault (OISF) is generated during high-temperature oxidation heat treatment), a vacancy dominant pure (VDP) area (an oxygen precipitate exists, but the oxygen precipitate is smaller in size than an oxygen precipitate in the O-band area), an interstitial dominant pure (IDP) area, and a B-band area in order of decreasing the V/G value (high to low).

Therefore, it is necessary to control the area where a grown-in defect is generated, and at the same time, to identify the distribution of the point defect in the defect-free area in advance at a step of growing crystal, and to accurately distinguish the boundary of the O-band area, the VDP area, and the IDP area.

The O-band area, the VDP area, the IDP area, and the B-band area may be distinguished through the copper haze method and the milk haze method disclosed in Korean Patent Laid-open Publication Nos. 10-0763834, 10-2037748, and 10-2060085, etc., and a defect area between the O-band area and the VDP area that has not been clearly distinguished before may be distinguished through reactive ion etching (RIE).

FIG. 1 is a view showing a correlation between the above-described pulling speed of the single crystal and crystal defect areas.

When evaluating RIE defect area, an RIE apparatus (e.g., dry etcher), which is expensive, is needed. In addition, since the RIE area in the existing VDP area is disposed close to the O-band area, there are difficulties such as process complexity and increased analysis time when using the milk haze evaluation method or the copper haze method.

SUMMARY OF THE INVENTION

Accordingly, the present invention is directed to a method of evaluating a defect area on a wafer that substantially obviates one or more problems due to limitations and disadvantages of the related art.

An object of the present invention is to provide a method of accurately evaluating an RIE defect area on a wafer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of evaluating a defect area on a wafer, the method including preparing a mirror-polished wafer, heat-treating the wafer, cleaning the wafer to remove an oxide film formed during the heat-treating, polishing the wafer, and evaluating a defect on a surface of the wafer.

The method of evaluating the defect area on the wafer may further include classifying a size of an oxygen precipitate detected in the evaluating the defect on the surface of the wafer.

The heat-treating may be performed at a temperature of 900° C. to 1100° C. for 1 to 16 hours.

The mirror-polished wafer may have a reactive ion etching (RIE) defect area containing an oxygen precipitate, and the RIE defect area may be provided between an O-band area and a vacancy dominant pure (VDP) area. Here, the O-band area may be an area where an oxidation induced stacking fault (OISF) defect is generated in a ring shape in an edge area or a central area, and the VDP area may be an area in which vacancy is dominant.

In the heat-treating, an oxide film may be formed on the surface of the wafer, the oxygen precipitate may grow in size, and a new oxygen precipitate may be formed.

The oxide film may be removed using hydrofluoric acid.

The evaluating the defect on the surface of the wafer may be performed using a particle-counter (P-counter) or a MAGICS (Multiple image Acquisition for Giga-bit pattern Inspection with Confocal System).

In the evaluating the defect on the surface of the wafer, an RIE defect area may be determined. Here, the RIE area may be an area having three or more consecutive points, each of the points having the density of oxygen precipitates of 2 ea/cm$^2$ or more, and the density is obtained by calculating the density of the oxygen precipitates at intervals of 1 millimeter in a radial direction of the wafer after classifying the size of the oxygen precipitate detected in the evaluating the defect on the surface of the wafer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, embodiments of the present invention will be described in detail with reference to the accompanying drawings.

The embodiments of the present invention may be modified into various forms, and the scope of the present invention should not be construed as being limited to the following embodiments. These embodiments are provided so that this disclosure will be thorough and complete, and will fully convey the scope of the disclosure to those skilled in the art.

In addition, relative terms such as, for example, "first", "second", "on/upper/above" and "beneath/lower/below", used in the following description may be used to distinguish any one substance or element from another substance or element without requiring or implying any physical or logical relationship or sequence between these substances or elements.

Figure 1:
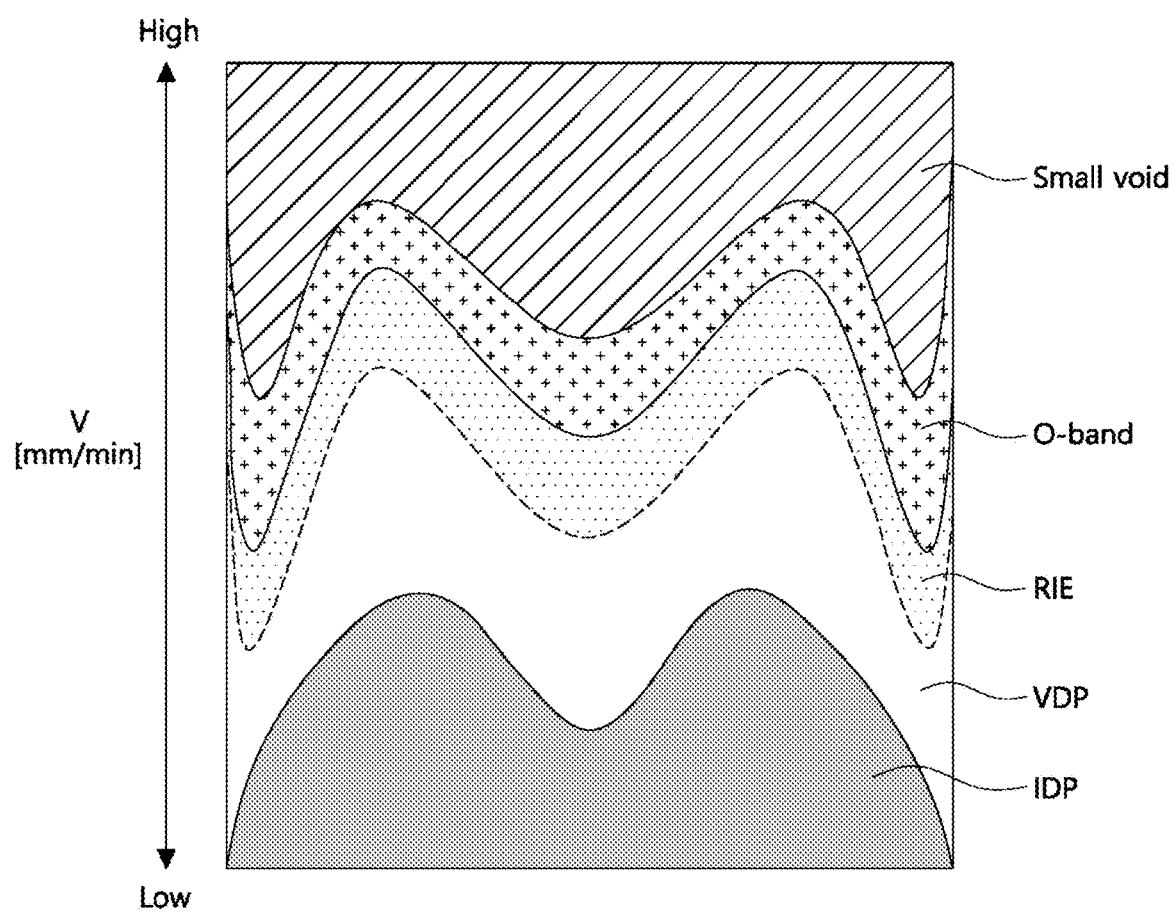
FIG. 1 is a view showing a correlation between a pulling speed of a single crystal and crystal defect areas.
Figure 2:
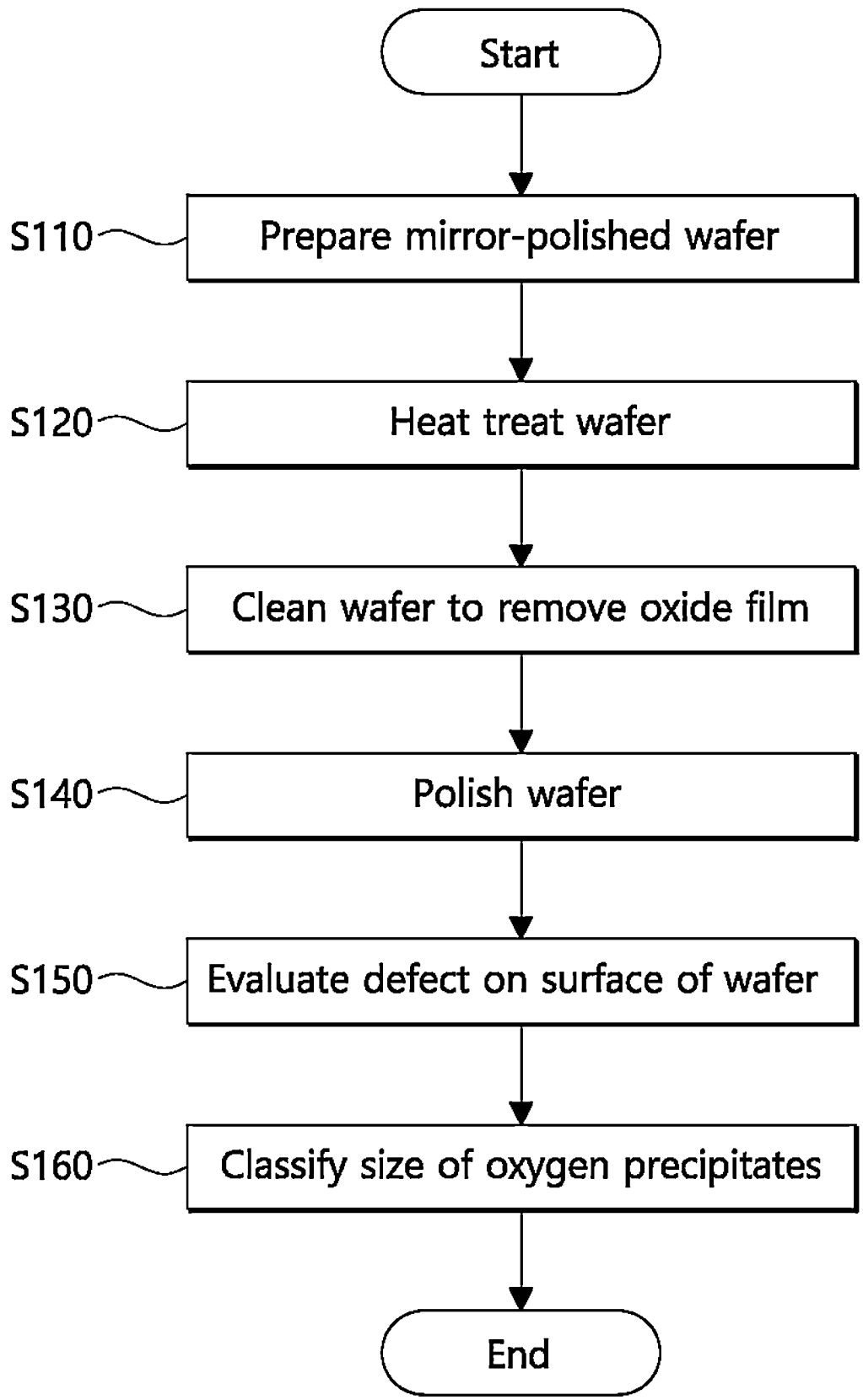
FIG. 2 is a flowchart of one embodiment of a method of evaluating a defect area on a wafer according to the present invention.

FIG. 2 is a flowchart of one embodiment of a method of evaluating a defect area on a wafer according to the present invention.

The method of evaluating a defect area on a wafer according to the present embodiment includes preparing a mirror-polished wafer in step S110, heat-treating the wafer in step S120, cleaning the wafer to remove an oxide film formed during the heat-treating in step S130, polishing the wafer in step S140, evaluating a defect on a surface of the wafer in step S150, and classifying a size of an oxygen precipitate detected in the evaluating the defect on the surface of the wafer in step S160.

Hereinafter, the method of evaluating the defect area on the wafer according to the above-described embodiment will be described with reference to FIGS. 3 to 7.

First, a mirror-polished wafer is prepared. Here, the wafer may be subjected to a grinding process of processing an outer circumferential surface of a single crystal silicon ingot grown using the Czochralski method or the like, a slicing process of thinly cutting the single crystal silicon ingot into wafers, a lapping process of polishing the wafer to a desired thickness to improve flatness, an etching process of removing a damaged layer inside the wafer, and a polishing process for surface mirror finish and improvement of flatness.

Figure 3:
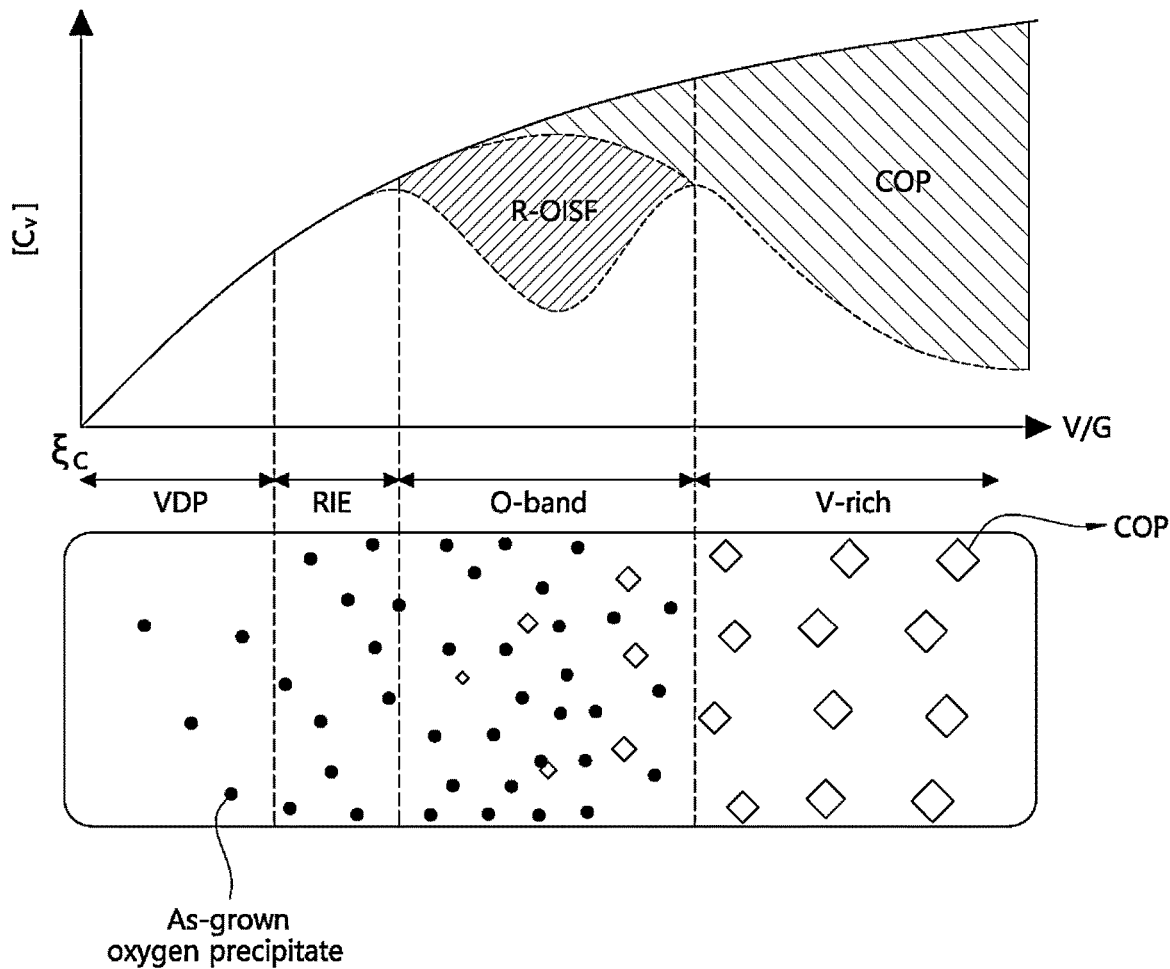
FIG. 3 shows a concentration of a point defect and a distribution of an oxygen precipitate depending on V/G change.

FIG. 3 shows a concentration of a point defect and a distribution of an oxygen precipitate depending on V/G change.

The mirror-polished wafer prepared by the above process shows the concentration of the point defect and the distribution of the oxygen precipitate in FIG. 3. As shown, the density of crystal originated particles (COP) is high in a V-rich area where V/G is high, and an as-grown oxygen precipitate is generated in an O-band area and a vacancy dominant pure (VDP) area. Here, the oxygen precipitate may be referred to as an as-grown oxygen precipitate in order to distinguish the oxygen precipitate from an oxygen precipitate generated in the heat-treating to be described later.

The RIE defect area may be provided between the O-band area and the VDP area. Here, the O-band area may be an area where an oxidation induced stacking fault (OISF) defect is generated in a ring shape in an edge area or a central area, and the VDP area may be an area in which vacancy is dominant. The reactive ion etching (RIE) defect area may include the aforementioned as-grown oxygen precipitate.

Here, the difference between the O-band area and the VDP area is that an as-grown oxygen precipitate is large in size and the density of as-grown oxygen precipitates is high in the O-band area having a relatively high vacancy concentration, whereas an as-grown oxygen precipitate may decrease in size and the frequency of formation thereof may gradually decrease in the VDP area having a relatively low vacancy concentration.

In FIG. 3, since the distribution of defects of the as-grown oxygen precipitates is determined while the single crystal ingot is grown, the difference in density in the bulk direction is not large. That is, the distribution (density) of defects on the surface of the wafer and the distribution (density) of defects on the bulk are similar at the same location.

Since the size of the defect due to the as-grown oxygen precipitate is very small and it is difficult to directly evaluate the defect, the distribution of as-grown oxygen precipitates may be detected after performing the heat-treating to grow the defect. However, since the defects due to the as-grown oxygen precipitates may be dissolved or new oxygen precipitates may be generated depending on the temperature or duration of heat-treating, setting the heat-treating condition is very important.

FIGS. 4A to 4D illustrate changes in as-grown defects before and after heat-treating the wafer, and during cleaning and polishing processes performed after the heat-treating.

Figure 4A:
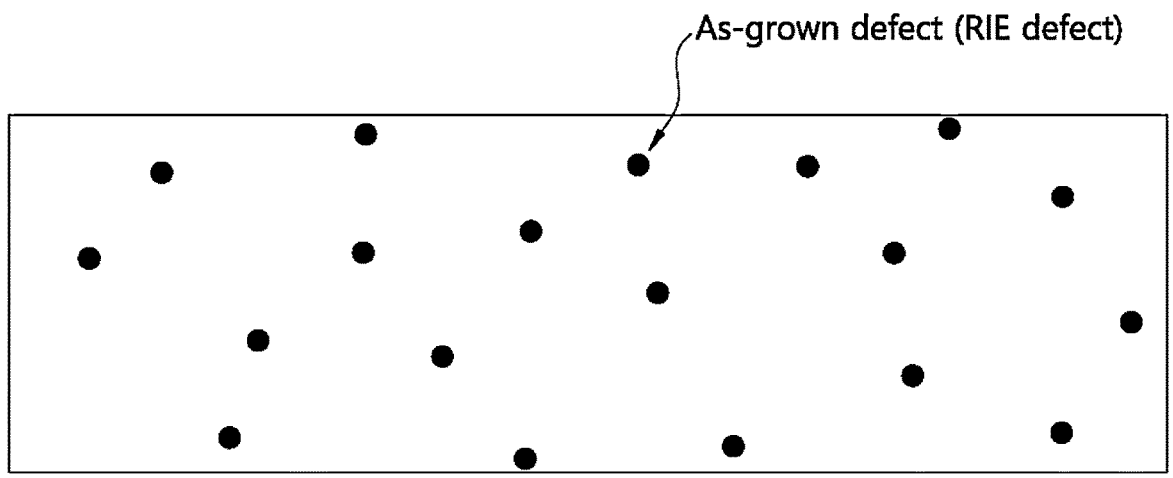
FIGS. 4A to 4D illustrate changes in as-grown defects before and after heat-treating a wafer, and during cleaning and polishing processes performed after the heat-treating.

In FIG. 4A, as-grown defects, which are RIE defects, are shown on the mirror-polished wafer.

Figure 4B:
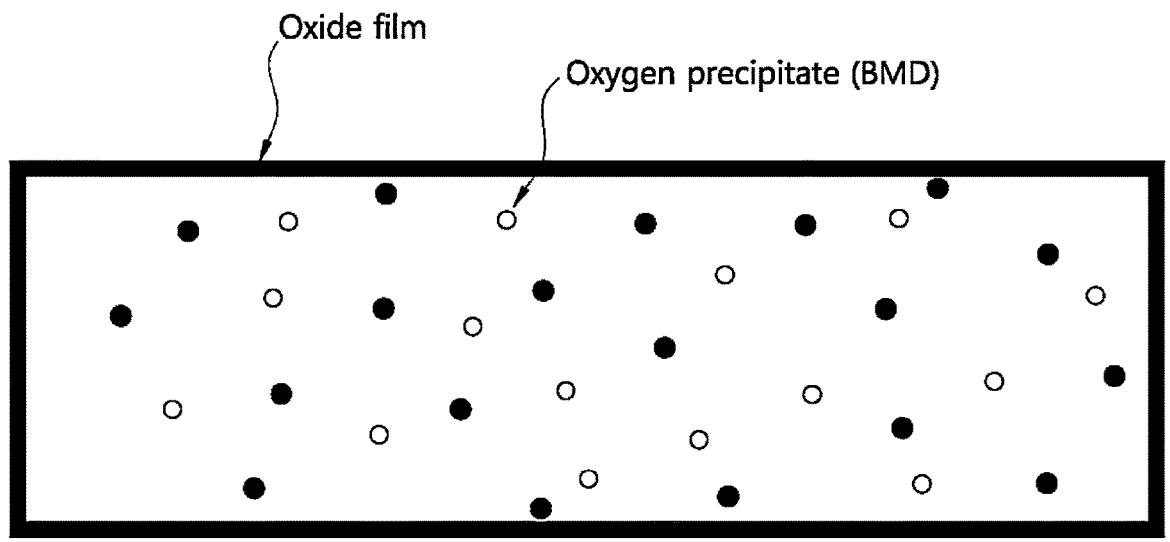

In FIG. 4B, the wafer may be heat treated at a temperature of 900° C. to 1100° C. for 1 to 16 hours. Through the heat-treating, an oxide film may be formed on the surface of the wafer, and the size of some of the as-grown oxygen precipitates may be grown. Here, it is necessary to minimize the growth of new oxygen precipitates (BMD, Buk Micro Defect).

Since the as-grown oxygen precipitate needs to be grown to the size larger than the size detectable by a surface defect inspection apparatus (P-counter or MAGICS), which will be described later, the oxygen precipitate needs to be heat treated at a temperature of 900° C. to 1100° C. for 1 to 16 hours, which are higher temperature and longer durations than those of oxidation heat-treating performed on a general semiconductor device.

Figure 4C:
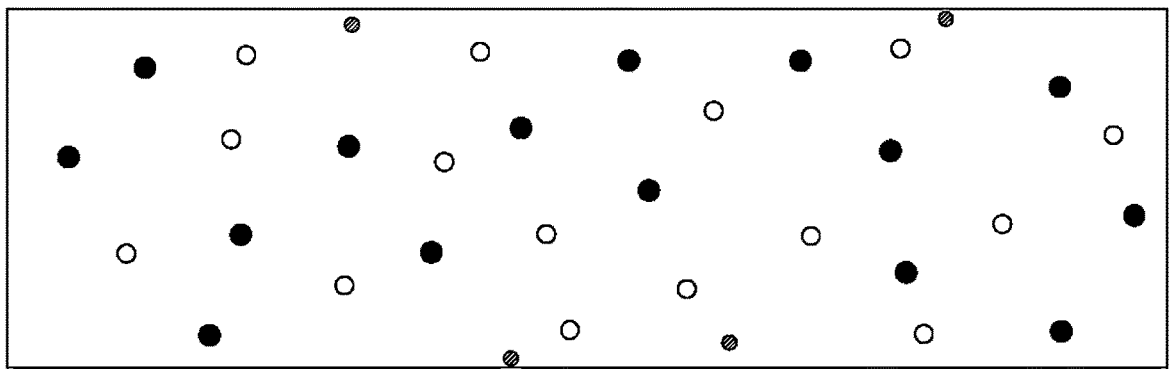

Then, as illustrated in FIG. 4C, the oxide film generated in the heat-treating of FIG. 4B is removed using hydrofluoric acid (HF).

Figure 4D:
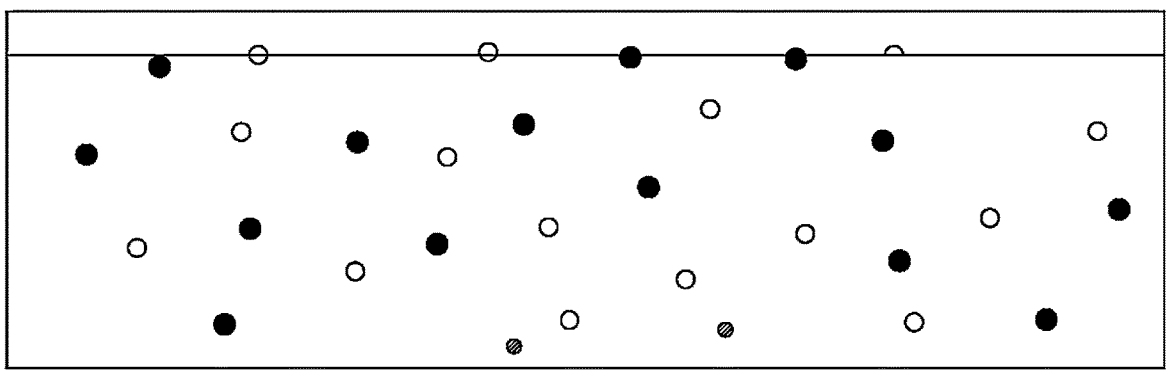

Moreover, because it is difficult to grow oxygen precipitates on a near surface of the wafer due to oxygen out-diffusion occurring during the heat-treating, the surface is polished down by several micrometers (μm), for example, 1 to 10 micrometers as illustrated in FIG. 4D.

In addition, when using the surface defect inspection apparatus such as P-counter or MAGICS after completion of the polishing process, not only the as-grown oxygen precipitate, which is grown in size, but also an oxygen precipitate, newly generated during the above-described heat-treating, a polishing induced defect (PID), particles, and the like may all be detected.

Therefore, in order to identify only the distribution of defect due to the as-grown oxygen precipitate, it is necessary to classify only the defect present in the RIE area from the defects detected using the surface defect inspection apparatus.

In the present invention, the size of the defect obtained when detecting the surface defect is used in order to classify only the defect present in the RIE area.

That is, since most as-grown precipitates formed in the same crystal area are similar in size, it may be determined that as-grown precipitates that are additionally grown after the heat-treating are also similar in size. In addition, the size of the as-grown oxygen precipitate having the same property varies depending on the difference in the precipitation environment such as vacancy concentration. Specifically, the size of the as-grown oxygen precipitate in the O-band area is the largest, and the size thereof decreases in the order of the RIE area and the VDP area.

In addition, the oxygen precipitates newly formed by the heat-treating have a relatively small size compared to the as-grown precipitate. Meanwhile, PID or particles may exist in various sizes.

In the present invention, in-plane density of defects of a predetermined size present on the wafer is calculated so as to set the state in which points, each of which has the density of a predetermined value or more (the value changes depending on the RIE condition), are present in succession in a radial direction as a standard.

Figure 5:
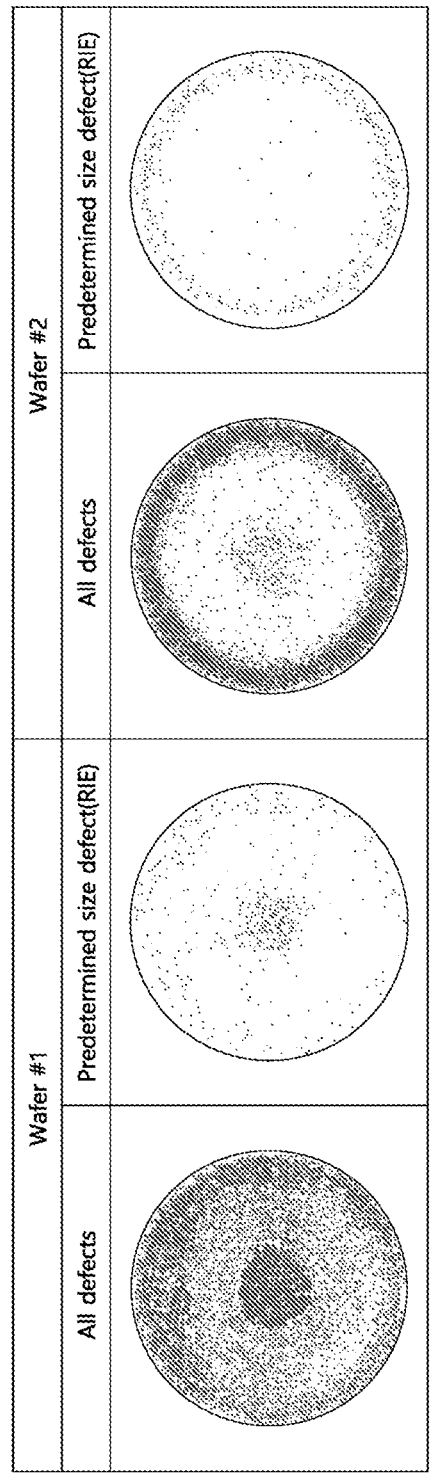
FIG. 5 shows a distribution of only reactive ion etching (RIE) defects obtained by the method of the present invention.
Figure 6:
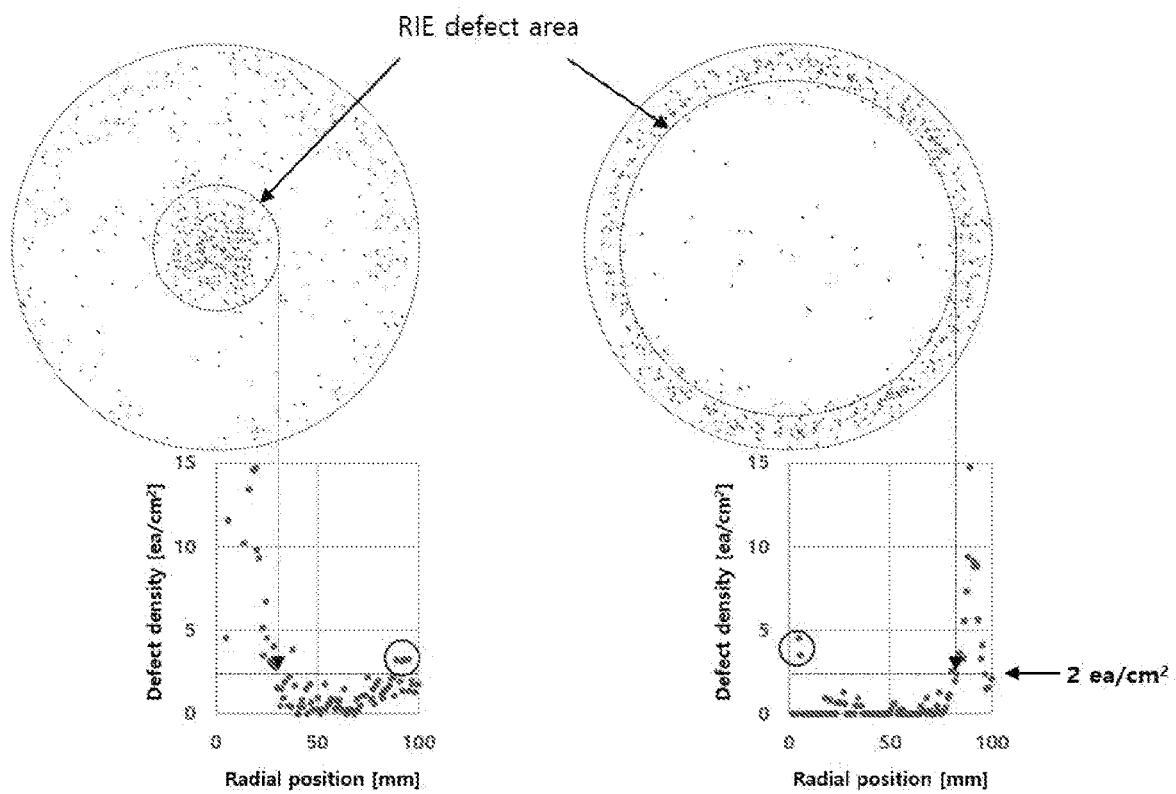
FIG. 6 shows quantified distributions of in-plane RIE defects obtained by calculating the defect density in a radial direction, defining an area where the defect density is equal to or greater than a predetermined value as an RIE area, and removing noise generated in an evaluation process.

FIG. 5 shows a distribution of only reactive ion etching (RIE) defects obtained by the method of the present invention, and FIG. 6 shows quantified distributions of in-plane RIE defects obtained by calculating the defect density in the radial direction, defining an area where the defect density is equal to or greater than a predetermined value as an RIE area, and removing noise generated in the evaluation process.

In the present invention, the defect density is calculated at intervals of 1 millimeter in the radial direction of the wafer, and an area having three or more consecutive points, each of the points having the defect density of 2 ea/cm$^2$ or more, is defined as the RIE area. However, when the duration or temperature of heat-treating performed on the wafer is changed, the above-described density standard may be changed.

In FIG. 5, all defects of two sample wafers (Wafer #1 and Wafer #2) and RIE areas analyzed and defined by the above method are shown.

In FIG. 6, for example, a portion indicated by a blue circle has the density of 2 ea/cm$^2$, but the portion is not determined as the RIE area because the condition of three consecutive points is not satisfied.

Figure 7:
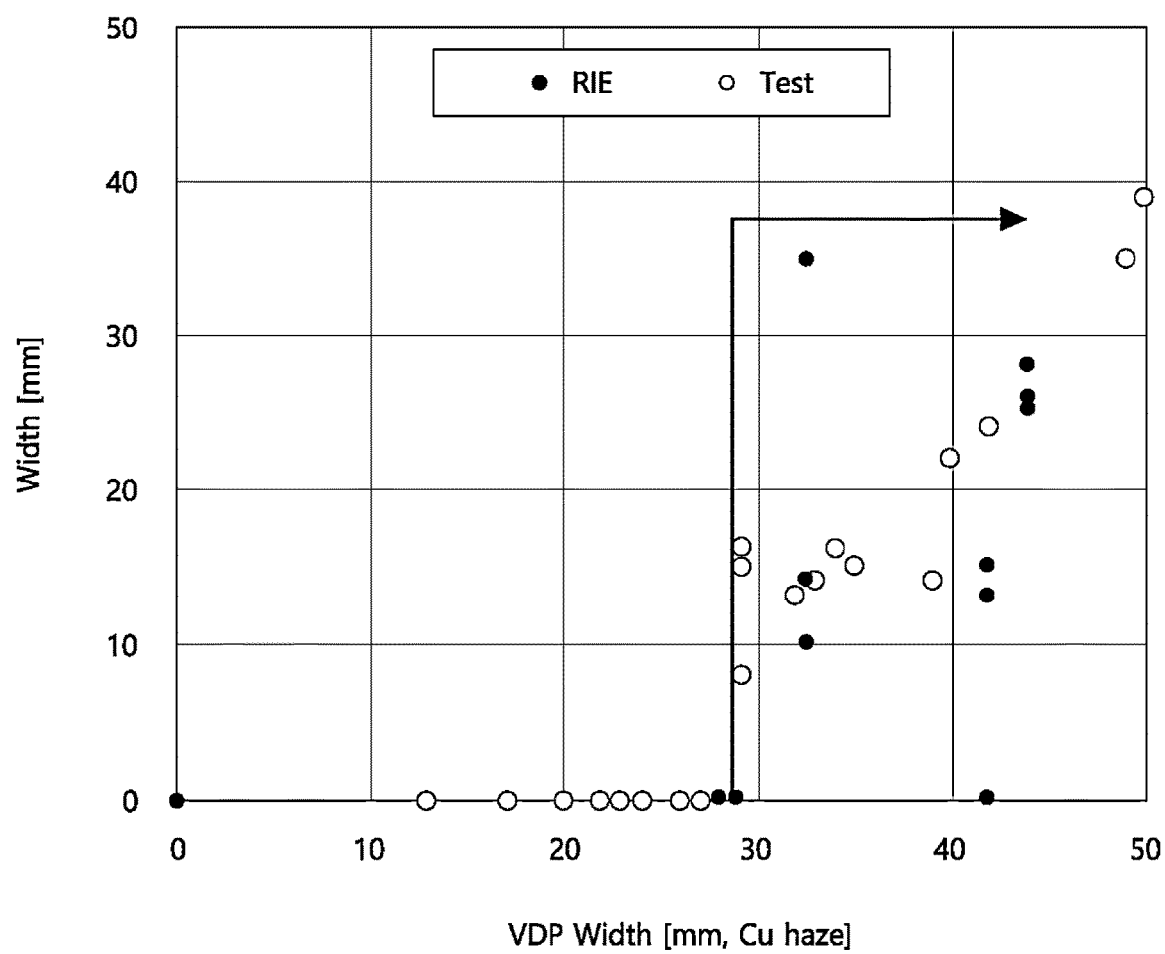
FIG. 7 is a graph comparing the RIE evaluation method of the related art and the RIE evaluation method of the present invention.

FIG. 7 is a graph comparing the RIE evaluation method of the related art and the RIE evaluation method of the present invention.

In the present invention, a conservative condition is applied in consideration of a margin of an evaluation wafer (200 mm). Based on the VDP width in the copper haze method, the RIE area is generated when the VDP width is 30 mm or more in the RIE evaluation method of the related art, and the RIE area is generated when the VDP width is 29 mm or more in the RIE evaluation method of the present invention. Therefore, it is confirmed that the results of the two methods are well matched.

The method of evaluating the defect area on the wafer according to the present invention may exclude a defect added during the processes of heat-treating and polishing, and may define the RIE defect area using the in-plane density of defects of a predetermined size or greater.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method of evaluating a defect area on a wafer, the method comprising:

preparing a mirror-polished wafer;

heat-treating the wafer;

cleaning the wafer to remove an oxide film formed during the heat-treating;

polishing the wafer; and evaluating a defect on a surface of the wafer, wherein the mirror-polished wafer has a reactive ion etching (RIE) defect area containing oxygen precipitate, wherein the RIE defect area is provided between an O-band area and a vacancy dominant pure (VDP) area, and wherein:
the O-band area is an area where an oxidation induced stacking fault (OISF) defect is generated in a ring shape in an edge area or a central area, and
the VDP area is an area in which vacancy is dominant.

2. The method according to claim 1, further comprising:
classifying a size of an oxygen precipitate detected in the evaluating the defect on the surface of the wafer.

3. The method according to claim 1, wherein the heat-treating is performed at a temperature of 900° C. to 1100° C. for 1 to 16 hours.

4. The method according to claim 1, wherein, in the heat-treating, the oxide film is formed on the surface of the wafer, the oxygen precipitate grows in size, and a new oxygen precipitate is formed.

5. The method according to claim 1, wherein the oxide film is removed using hydrofluoric acid.

6. The method according to claim 1, wherein the evaluating the defect on the surface of the wafer is performed using a particle-counter (P-counter) or a MAGICS (Multiple image Acquisition for Giga-bit pattern Inspection with Confocal System).

7. The method according to claim 1, wherein the RIE defect area is determined in the evaluating the defect on the surface of the wafer, and
wherein the RIE area is an area having three or more consecutive points, each of the points having a density of oxygen precipitates of 2 ea/cm$^2$ or more, and the density is obtained by calculating the density of the oxygen precipitates at intervals of 1 millimeter in a radial direction of the wafer after classifying a size of the oxygen precipitate detected in the evaluating of the defect on the surface of the wafer.

8. A method of evaluating a defect area on a wafer, the method comprising:
preparing a mirror-polished wafer;
heat-treating the wafer;
cleaning the wafer to remove an oxide film formed during the heat-treating;
polishing the wafer; and
evaluating a defect on a surface of the wafer,
wherein the evaluating of the defect on the surface of the wafer is performed using a particle-counter (P-counter) or a MAGICS (Multiple image Acquisition for Giga-bit pattern Inspection with Confocal System), and
wherein the heat-treating is performed at a temperature of 900° C. to 1100° C. for 1 to 16 hours to grow an oxygen precipitate to a size larger than a detectable limit of the particle-counter or the MAGICS.

9. The method according to claim 8, further comprising:
classifying an oxygen precipitate formed in an RIE area among the oxygen precipitate based on a size of the oxygen precipitate detected in the evaluating of the defect on the surface of the wafer.

10. The method according to claim 9, wherein, in the heat-treating, the oxide film is formed on the surface of the wafer, oxygen precipitate formed in the RIE area grows in size, and a new oxygen precipitate is formed.

11. The method according to claim 10, wherein the oxide film is removed using hydrofluoric acid.

12. The method according to claim 8, wherein an RIE (reactive ion etching) defect area is determined in the evaluating the defect on the surface of the wafer, and
wherein the RIE area is an area having three or more consecutive points, each of the points having a density of oxygen precipitates of 2 ea/cm$^2$ or more, and the density is obtained by calculating the density of the oxygen precipitates at intervals of 1 millimeter in a radial direction of the wafer after classifying a size of the oxygen precipitate detected in the evaluating the defect on the surface of the wafer.

13. A method of evaluating a defect area on a wafer, the method comprising:
preparing a mirror-polished wafer;
heat-treating the wafer;
cleaning the wafer to remove an oxide film formed during the heat-treating;
polishing the wafer; and
evaluating a defect on a surface of the wafer,
wherein an RIE (reactive ion etching) defect area is determined in the evaluating the defect on the surface of the wafer, and
wherein the RIE area is an area having three or more consecutive points, each of the points having a density of oxygen precipitates of 2 ea/cm$^2$ or more, and the density is obtained by calculating the density of the oxygen precipitates at intervals of 1 millimeter in a radial direction of the wafer after classifying a size of the oxygen precipitate detected in the evaluating of the defect on the surface of the wafer.

14. The method according to claim 13, further comprising:
classifying a size of the oxygen precipitate detected in the evaluating of the defect on the surface of the wafer.

15. The method according to claim 13,
wherein the heat-treating is performed at a temperature of 900° C. to 1100° C. for 1 to 16 hours.

16. The method according to claim 13, wherein, in the heat-treating, the oxide film is formed on the surface of the wafer, the oxygen precipitate grows in size, and a new oxygen precipitate is formed.

17. The method according to claim 13, wherein the oxide film is removed using hydrofluoric acid.

* * * * *